United States Patent [19]
Dumas

[11] 3,970,843
[45] July 20, 1976

[54] PHOTOSENSITIVE JUNCTION DEVICES HAVING CONTROLLABLE SENSITIVITY

[75] Inventor: Guy H. Dumas, Paris, France

[73] Assignee: Silec-Semi-Conducteurs, Paris, France

[22] Filed: Nov. 19, 1974

[21] Appl. No.: 525,108

[30] Foreign Application Priority Data
Nov. 30, 1973 France .............................. 73.42855

[52] U.S. Cl. .............................. 250/211 J; 357/30; 20/572
[51] Int. Cl.² ........................................ H01L 27/14
[58] Field of Search .............. 250/211 J; 357/29, 30; 148/171; 29/572

[56] References Cited
UNITED STATES PATENTS

| | | | |
|---|---|---|---|
| 3,296,502 | 1/1967 | Gross et al. ................... | 250/211 X J |
| 3,529,217 | 9/1970 | Van Santen .................. | 250/211 X J |
| 3,745,424 | 7/1973 | Ohuchi et al. ........................ | 357/30 |
| 3,761,326 | 9/1973 | Weckler ................................ | 357/30 |
| 3,814,993 | 6/1974 | Kennedy ............................... | 357/30 |

*Primary Examiner*—Walter Stolwein
*Attorney, Agent, or Firm*—Roylance, Abrams, Berdo & Kaul

[57] ABSTRACT

The present invention relates to photosensitive device comprising a plurality of superposed semiconductive layers, wherein grooves are hollowed on the face exposed to the irradiance in order to reach and to pass through the junctions upon which the operation of the device is dependent and filled with a passivating agent transparent to the incoming light, the improvement being that the sizes of the grooves are selected in order to obtain a maximum efficient volume exposed to the irradiance close to the junctions upon which the operation of the device is dependent and to minimize the the cross-section of the junction.

The present invention permits to obtained more efficient photothyristors and phototriacs.

9 Claims, 10 Drawing Figures

MANUFACTURING STEPS

PHOTOSENSITIVE JUNCTION DEVICES HAVING CONTROLLABLE SENSITIVITY

FIELD OF THE INVENTION

The invention relates to photosensitive junction devices and, more specifically, to devices such as thyristors or triacs capable of being triggered by a low irradiance, able to withstand high voltages, and having a controllable sensitivity as regards transient voltages or currents.

DESCRIPTION OF THE PRIOR ART

A thyristor consists of four successive zones I, II, III and IV of alternate conductivity types forming three junctions A, B and C respectively comprised between the zones I and II, II and III, and III and IV. A bias applied in a suitable direction between the utmost zones biases the junctions A and C in the direct direction while the junction B is reverse biased and practically blocks all the applied voltage, allowing only its own leakage current to flow. Such a thyristor can be made conductive, either by generation of a photocurrent at the junction B by means of an external irradiance, or by a current fed at the level of the zones II or III.

As known in the art, the photosensitivity of a photothyristor is dependent upon two main parameters: on one hand, the sum of the current gains in the common base connection of the two transistors equivalent to the thyristor, the first transistor being formed by the zones I, II and III and the second one by the zones II, III and IV, and, on the other hand, the value of the photocurrent produced at the blocking junction B by an external irradiance. The first parameter can be optimized for increasing the photosensitivity by acting on the diffusion parameters of the device (concentration, life time, width of the bases of the equivalent transistors) and on the geometrical shape of the structures. The second parameter is mainly dependent upon the depth of the metallurgic junction B, the thickness of the depletion region and the diffusion lengths of the minoritary carriers in the zones I and III. It is clear that, before optimizing those two parameters, the irradiance spectrum has to be in accordance with the nature of the used semi-conductive material.

In order to increase the photosensitivity of a photothyristor, an approach of the prior art was to make planar type devices allowing a surface outcrop of the metallurgic junctions. Another known method consists of locally hollowing the semiconductor material over the junction B without crossing it. A drawback of the first method is that the voltage withstand of the obtained device is generally low. A drawback of the devices according to the second method is that the voltage ramp withstand is not good in consideration of the important surface of the junction B.

Accordingly, a main object of this invention is to provide commutating devices having the three following advantages:
high photo-electric sensitivity,
high voltages withstanding,
sensitivity adjustable transient currents or voltages.

SUMMARY OF THE INVENTION

For achieving this object, this invention provides commutating devices wherein the different layers have new geometrical shapes, and provides, in particular, the use of grooving techniques. According to this invention, the photosensitivity is increased by allowing to practically all the absorbed photons to generate electron-hole pairs efficient for the photocurrent. The voltage withstand is improved by providing plane metalurgic junctions, and an insensitivity to the transient voltage ramps is obtained by a decrease of the blocking junction surface which has thus a very low junction capacitance, and by the provision of auxiliary connections allowing external adjustments of the electrical and photoelectrical sensitivities.

These objects, characteristics and advantages and others of this invention will be described in detail in the following disclosure of preferred embodiments made together with the attached drawings wherein.

DESCRIPTION OF THE PREFERRED EMBODIMENTS

This prior art device constitutes the starting point for the manufacture of a device according to the invention and, therefore, can be regarded as the first manufacturing step in making such a device.

Figure 1A:
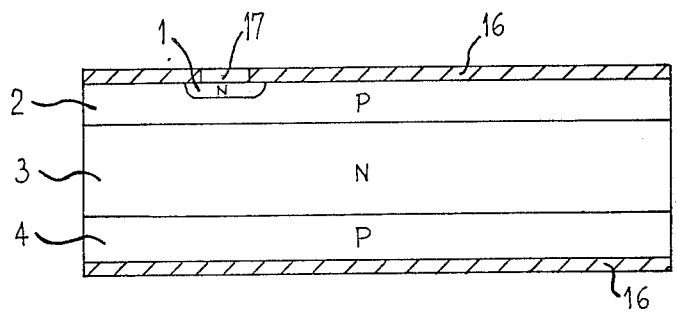
FIGS. 1a, 1b, 1c and 1d show schematically different manufacturing steps of a photothyristor according to the invention.

FIG. 1a shows a thyristor of the prior art after the diffusion steps and before the necessary connection metallizations. This figure, given as an example, shows four overlapping layers 1, 2, 3 and 4 of alternate conductivity type (NPNP). This device is overcoated on its two faces of a $SiO_2$ layer 16 in which a window 17 is opened through which the layer 1 has been diffused. In a preferred embodiment, the semi-conductive substrate is made of N-type little doped silicon having a thickness of about 200 microns. The depths of the layers 2 and 4 are in the range of 30 to 40 microns and the depth of the layer 1 is in the range of 10 to 15 microns.

Figure 1B:
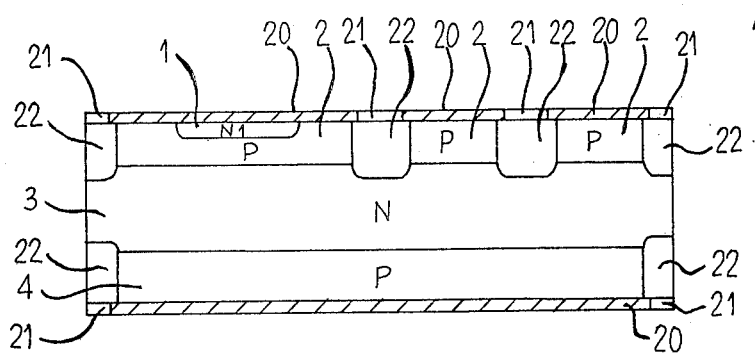
Figure 1C:
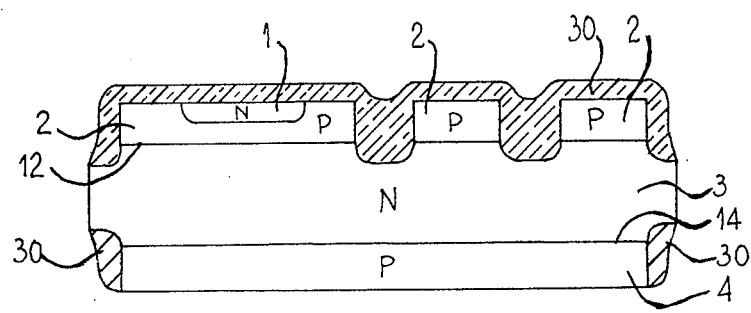
Figure 1D:
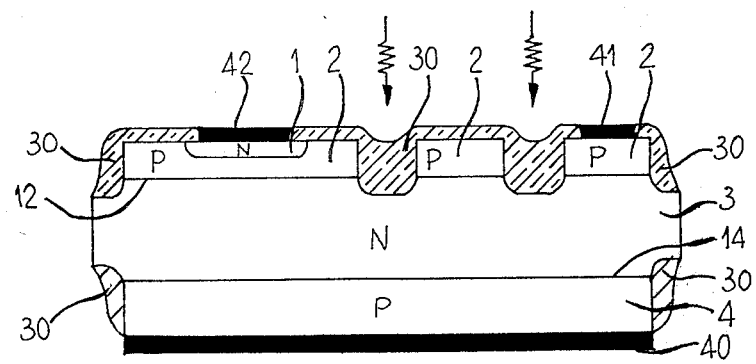

Referring to FIGS. 1b, 1c, and 1d, the manufacturing method of a thyristor according to the invention will now be disclosed. The two faces of the device shown in FIG. 1a are, for example, chemically deoxidized and coated by a photosensitive resin 20, of the KMER-type for example, which is developed according to a suitable masking in order to form windows 21. Then, the device is etched to a depth greater than the one of the zones 2 and 4, respectively and typically of about 50 microns. Accordingly, the open junctions between the zones 2 and 3 and 4 and 3 are orthogonally outcropping at the surface of the grooves.

Referring to FIG. 1c, after the removal of the resin and a suitable cleaning, the previously obtained grooves 22 are filled with a passivating agent 30, for example a glass frit which is baked. This helps the blocking junctions withstand the applied voltage. The blocking junctions are the junction 12 between layers 2 and 3, in direct biasing and junction 14 between layers 3 and 4 in reverse biasing. The thus passivated junctions can withstand high bias voltages which can be typically of about 1,000 volts.

FIG. 1d shows the last step of the manufacture of the device according to the invention, wherein windows are made in the passivating agent layer 30 for obtaining the contacts 40, 41 and 42, which are the anode, gate and cathode contacts respectively.

If the face of the thyristor comprising the layers 1 and 2 is called the upper face and if the face comprising the layer 4 is called the lower face, it must be emphasized that the effect of the passivating agent in the grooves provided on the two faces of the device is different. As a matter of fact, on the lower face 4, the groove provided on the edge of the device and filled with a passivating material is mainly provided for allowing withstanding high voltage. The grooves on the upper face have on the one hand this effect of permitting the exposed junctions to withstand high bias voltages, and on the other hand the effect of providing a passage for the photons, incident to the upper face of the device, and which will be accordingly absorbed in the efficient regions of the blocking junction 12. The passivating agent has accordingly to be a material transparent for the photons allowing the triggering of the thyristor, at least on the upper face of this thyristor. For the sake of manufacturing convenience, the same passivating agent will generally be provided on the upper and lower faces, but it has to be noted that it is not necessary that the passivating agent in the grooves of the lower face be a transparent material.

Figure 2A:
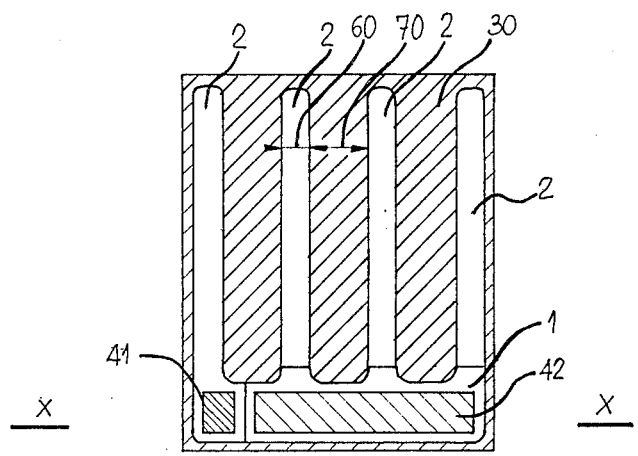
FIGS. 2a and 2b show upper and section front views of an embodiment of a photothyristor according to this invention.
Figure 2B:
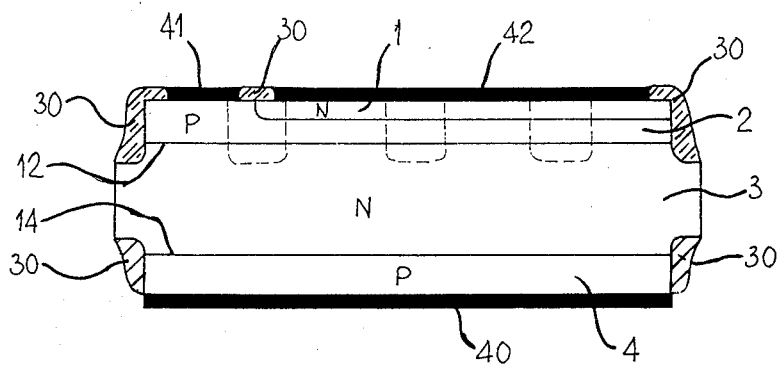

Referring to FIGS. 2a, and 2b, an embodiment of a thyristor according to the invention, obtained by the hereinabove indicated manufacturing method, will be described. As already seen, the electron-hole pairs produced by photon absorption in the silicon are efficient for the photocurrent only if they are produced in the space charge region of the blocking junction, or at a distance smaller than some diffusion lengths of minority carriers of the adjacent regions. For increasing the photosensitivity, the previously described grooves are open at a depth greater than the thickness of layer 2, in order that all the absorbed photons be directly absorbed in the space charge region, or in the space of some diffusion lengths of the minority carriers of the layer 3. This latter layer being very poorly doped, the typical diffusion lengths are large, about 100 microns. Furthermore, various known restoration treatments allow increasing the life time in layer 3. Accordingly, the parts of layer 2 remaining after the grooving can be reduced to a minimum, their only effect being to collect the gate current. It results that the device according to the invention provides, as is shown in FIG. 2a and 2b, a very small metallurgic junction surface 12. For example, in the described preferred embodiment, the remaining strips of layer 2, after the grooving, have a width 60 of about 20 microns and the width 70 of the grooves 30 is about 150 microns. Accordingly, in this example, the surface of the junction 12 is practically limited to the surface beneath the metallization 42 arranged on the layer 1. It will be understood that the provided gate contact 41 is prima facie not necessary for a photothyristor but is useful for providing, for example, a photoelectric or electric desensitization of the device by means of an inpedance, or for triggering the thyristor by an electric current in the classical way, if wanted.

FIGS. 2a and 2b show a grooving of the lower and upper faces covering all the edge parts of those faces, the grooving on the lower face being used only to passivate an external junction, the grooving on the upper surface being used on the one hand for passivating an external junction, and on the other hand to facilitate the operation of photons on the junction between the layers 2 and 3. Furthermore, the grooving shown on the upper face in FIG. 2a consists of parallel grooves passing through the layer 2 and reaching the layer 3. It will be understood that any other pattern of such a grooving is provided by the invention, as long as between any points of the remaining layer 2 a possible electric path remains through this layer 2 until the gate metallization 41.

Thus far, preferred embodiments of unidirectional commutating photosensitive devices according to the invention have been described. The invention applies also to the increasing of the sensitivity, of the voltage the device can withstand and of the voltage gradiant withstandable by bidirectional devices of the triac type.

Figure 3A:
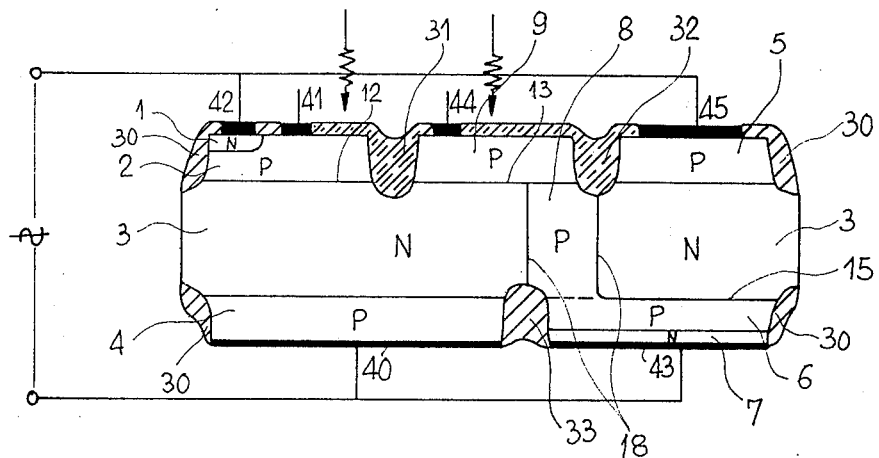
FIGS. 3a and 3b show a so-called caisson phototriac according to the invention.

FIG. 3a shows, as a schematical cross-section, a first embodiment of a phototriac according to the invention. This one can be considered as consisting of a first thyristor constituted of four layers 1, 2, 3 and 4 of N, P, N, P types respectively, intended and arranged as has been described, and of a second thyristor comprising the layers 5, 3, 6 and 7 of P, N, P, N types respectively. The first thyristor will also be called hereafter "direct thyristor" and the second one "reverse thyristor". When the first thyristor is reverse biased, the second one will be directly blocked, its blocking junction being the junction 15 between the layers 3 and 6. However, this junction 15 is too deep for incoming photons on the upper face of the device to be able to create electron-hole pairs in a sufficient quantity at the level of this junction for attaining a high sensitivity. So, the invention provides a deep diffusion 8 to be achieved between the layer 6 and the P-type surface layer 9, grooved according to the invention. This deep diffusion 8 has the shape of a column arranged substantially in the center of the whole device and is called a caisson. Accordingly, the holes produced by the incoming photon at the level of the junctions 13 between the layers 9 and 3 and the junction 18 between the layers 8 and 3 have a possible electrical path up to the layer 6 where they constitute the cathode gate current of the reverse thyristor. Besides, the metallizations 40, 41 and 42, connecting the first thyristor, this device comprises metallizations 43, 44 and 45 of anode, cathode gate, and cathode respectively, associated with the second thyristor constituting the triac. In operation, the connections 42 and 45 of the device are interconnected, as well as the connections 40 and 43 for constituting the two main electrodes of the device. Gate contacts 41 and 44 are available and may be used together or separately for acting on the electrical or photoelectrcal sensitivity of the phototriac device or for triggering conventionally the phototriac device by an electrical current.

FIG. 3a shows grooves 31, 32 and 33. The groove 31 allows the P-type layer 2 to be insulated from the P-type layer 9; the groove 32 insulates the P-type layer 9 from the P-type layer 5; and the groove 33 insulates the lower P-type layer 4 from the lower P-type layer 6. The lower groove 33 has only this insulating function, but it has to be noted that the grooves 31 and 32 of the upper layer have on the one hand the function of insulating the different parts constituting the triac and, on the other hand, allow the incoming photons onto the upper face to operate directly on the junctions 12 and 13 between the layers 2 and 3 and 9 and 3 respectively. Furthermore, it will be appreciated that the groove 32 allows the photons to penetrate directly in the section of the junction 18 between the caisson 8 and the layer 3, this mode of operation of the photons being particularly efficient for creating electron-hole pairs in the junction.

Figure 3B:
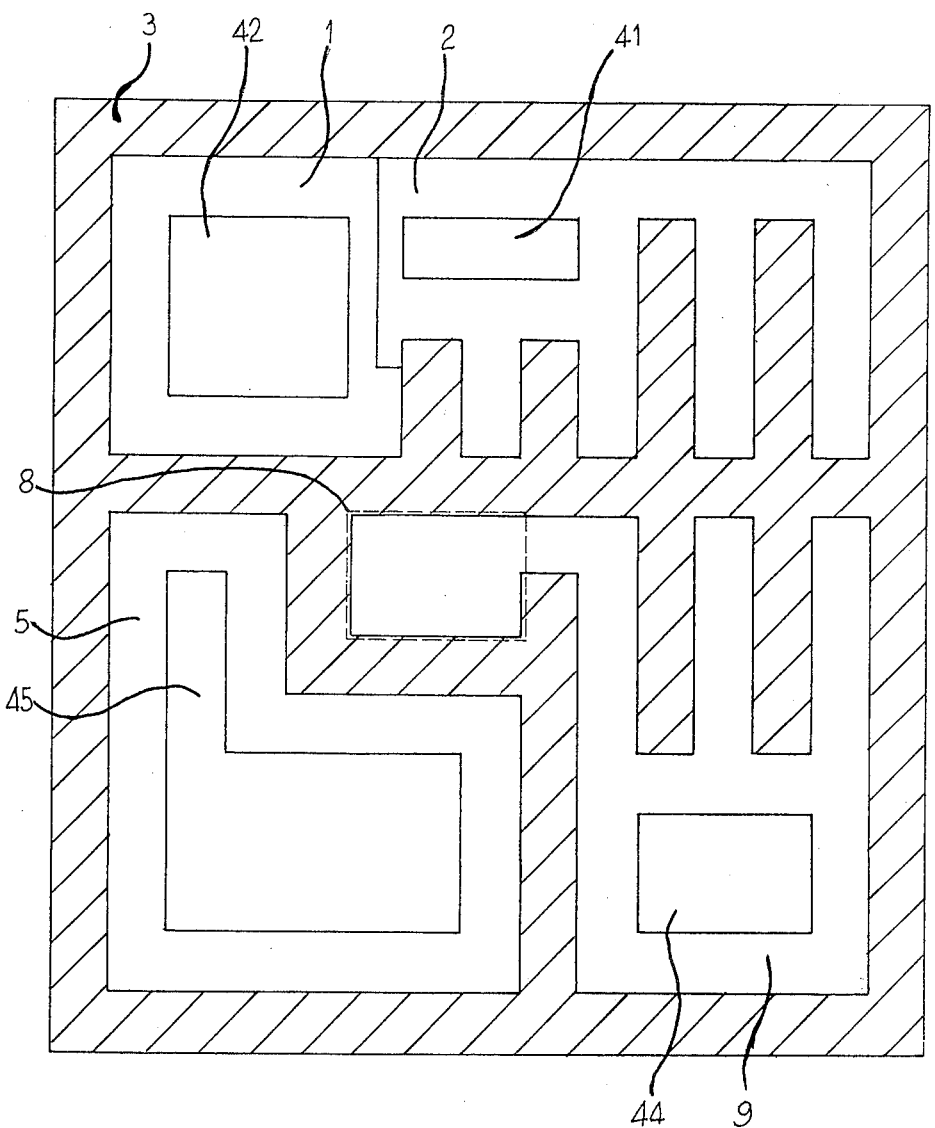

FIG. 3b shows an upper view of a preferred embodiment of a caisson phototraic according to the invention, shown very schematically in FIG. 3a. FIG. 3b is obviously not in concordance with the cross section of FIG. 3a which had only an explanatory purpose. In this FIG. 3b, it will be appreciated that the parts of P-type layers 2, 5 and 9 are insulated by grooves and that each of the parts of P-type layers 2 and 9 is partially grooved, but without interrupting its continuity. The dashed line 8 shows the location of the caisson, the end sides of which break through across the greater part thereof in grooved locations. The other reference numbers of FIG. 3b analogous to the ones of FIG 3a, reference will be made to the description made hereinabove in connection with FIG. 3a for understanding FIG. 3b.

Figure 4A:
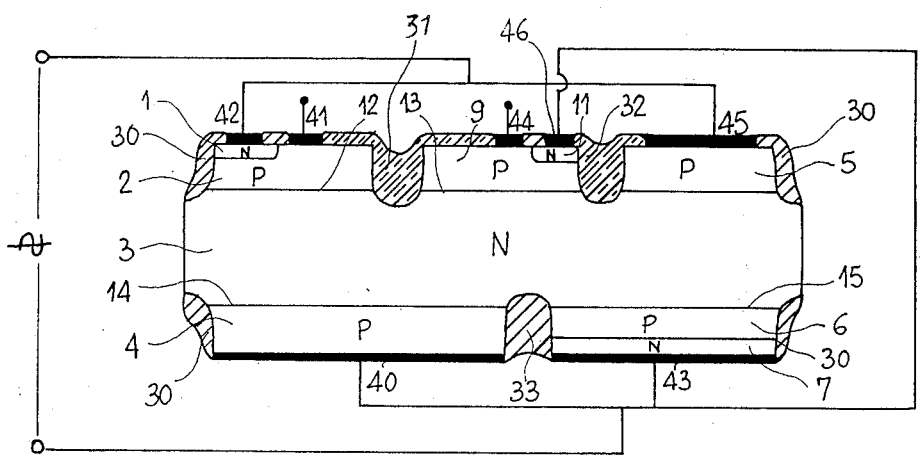
FIGS. 4a and 4b show a phototriac comprising an auxiliary triggering thyristor according to the invention.

FIG. 4a shows a second embodiment of a phototriac according to the invention comprising again a first thyristor called "direct thyristor" comprised of layers 1, 2, 3 and 4 and a second thyristor called "reverse thyristor" comprised of layers 5, 3, 6 and 7. However, instead of caisson 8 between layers 9 and 6, a diffused layer 11 is formed on the layer 9 and has a conductivity type opposed to the one of this layer 9. Accordingly, in response to irradiation of the upper face of the evice, the reverse thyristor is triggered by the auxiliary thyristor comprised of layers 11, 9, 3 and 5. In this auxiliary thyristor device, the layers 11, 9 and 3 are arranged as the layers 1, 2 and 3 of the direct thyristor, and comprise groovings according to the invention. Again, the connections 42 and 45 are interconnected in order to form the first main electrode; the connections 40 and 43 are also interconnected in order to form the second main electrode and are further connected to a connection 46 formed on the N-type layer 11 for suitably biasing the auxiliary thyristor. Gate contacts 41 and 44 can be used together or separately for an electrical triggering of the triac or a photoelectric desensitization of the first and second thyristors. But, contrarily to the devices shown in FIGS 3a and 3b, a reverse thyristor cathode gate is not available.

As in the case of the caisson phototriac shown in FIG. 3a, there are provided, in the embodiment shown in FIG. 4a, grooves 31 and 32 on the upper face of the device for insulating the one from the other P-type layers 2, 9 and 5 and a groove 33 on the lower face for insulating the P-type layers 4 and 6. It will be again understood that the grooves 31 and 32 have the double function of insulating and of transmitting photons towards the junctions 12 and 13, for creating therein directly electron-hole pairs.

Figure 4B:
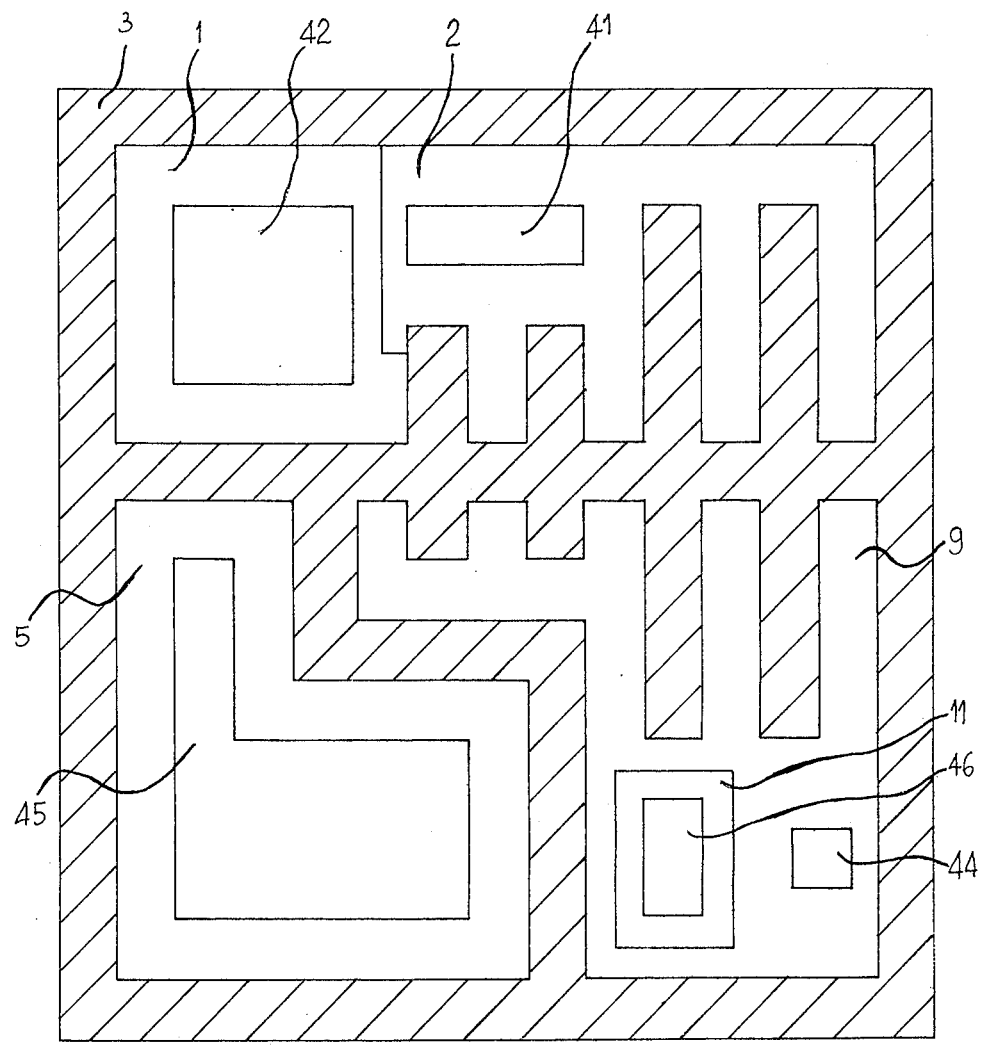

FIG. 4b shows an upper view of an embodiment of a phototriac comprising an auxiliary triggering thyristor. The groovings allowing the layer 3 to appear are provided for separating the P-type layers 2, 5 and 9 and, further, the P-type layers 2 and 9 are grooved for producing a more efficient action of the photons on the blocking junctions of the device according to the invention.

In this specification and in the appended claims, the conductivity type of the different layers of the device have been explicity indicated as being P-type or N-type. Those skilled in the art can understand that this does not constitute a limitation of the invention, the only requirement being that the conductivity types of the different layers be alternate, that is the P and N conductivity types can be exchanged. Further, in FIGS. 2a, 3b and 4b, there have been described specific embodiments of the grooving according to the invention. The geometrical shapes shown are only exemplary, the shape of the grooves being eventually different from the described shape without departing from the scope of the invention. Further, it will be understood that the sizes and proportions shown in those figures are not in correspondence with real sizes and proportions but have been chosen for the sake of simplicity. It is clear that the photo-response is the best one close to the space charge areas directly exposed to the irradiation, that is close to the junctions. The invention provides, as hereinover explained, for the blocking junction surface to be diminished to obtain improved voltage gradient withstanding. Those skilled in the art will understand that in any specific case of application, a compromise has to be made between said diminution and the achievement of as large an exposed blocking junction perimeter as possible.

It is to be understood that the embodiments described herein are merely illustrative of the invention. Various modifications thereto may be brought out by persons skilled in the art without departing from the spirit or the scope of the invention. Specifically, if the invention has been disclosed only in relationship with a photothyristor or a phototriac, the invention can be applied to other switching, detecting or amplifying photosensitive devices.

What is claimed is:

1. A photothyristor device having high photosensitivity and ability to withstand high voltages and voltage gradients comprising
    a substrate of a first type of semiconductor material having upper and lower major faces;
    a first layer of a second type of material on said lower face of said substrate;
    a second layer of said second type on said upper face of said substrate;
    a third layer of said first type of material on and partially covering the exposed surface of said second layer;
    means defining grooves extending through said second layer and into said substrate while leaving portions of said second layer continuous so that an electrical path remains through said second layer between any two points in said second layer,
    said grooves exposing planar junction regions between said second layer and said substrate; and
    a light-transmitting passivating material filling said grooves to permit irradiation of said junction regions therethrough.

2. A device according to claim 1 wherein
    said first type of semiconductor material is N-type and said second type is P-type.

3. A monolithic phototriac comprising a first "direct" thyristor according to claim 1 and a second "reverse" thyristor wherein the cathode gate layer is connected by a conductive "caisson" to a layer of the same conductivity type arranged on the upper face of the device, this latter layer being itself grooved.

4. A monolithic phototriac comprising a photothyristor according to claim 1 including a first "direct" thyristor, a second "reverse" thyristor and a third "auxiliary" thyristor allowing the triggering of the second thyristor, the first and third thyristors being grooved on the upper face of the phototriac.

5. A monolithic phototriac comprising a substrate of a first type of semiconductor material having upper and lower major faces;

a first layer of a second type of semiconductive material substantially covering said upper face of said substrate;

means defining first and second grooves extending through said first layer and into said substrate and dividing said first layer into first, second and third independent portions;

a second layer of said second type of material substantially covering said lower face of said substrate;

means defining a third groove extending through said second layer and into said substrate and dividing said second layer into first and second independent portions;

a third layer of said first type of material deposited on said first portion of said first layer;

a fourth layer of said first type of material deposited on said second portion of said second layer;

a column of said second type of material formed by deep diffusion extending through said substrate and interconnecting said second portion of said first layer and said second portion of said second layer with said third groove extending into said column; and light-transmitting passivating material filling said grooves to permit irradiation of the junctions exosed by said grooves, whereby a first "direct" thyristor is formed by said third layer, the first portion of said second layer, said substrate and the first portion of said second layer and a second "reverse" thyristor is formed by the third portion of said first layer, said substrate, the second portion of said second layer and said fourth layer.

6. A phototriac according to claim 5 wherein said first type of material is N-type and said second type is P-type.

7. A phototriac according to claim 5 wherein the cathode gate layers of the "reverse" and "direct" thyristors are provided with metallizations and connectons whereby the electric and photoelectric sensitivity of the phototriac can be set independently by an external circuit for each biasing direction of this phototriac.

8. A phototriac according to claim 5 and further comprising a fifth layer of said first type of material deposited on said second portion of said first layer;

a metallized layer on the outer surface of said second layer; and circuit means interconnecting said fifth layer and said metallized layer, said fifth layer, said second portion of said first layer, said substrate and said third portion of said first layer forming an auxiliary third photothyristor.

9. A phototriac according to claim 8 wherein the cathode gate layers of the first and third thyristors are provided with metallizations and connections whereby the photoelectric sensitivity of the phototriac can be set independently for each biasing direction.

* * * * *